United States Patent [19]

Anthony

[11] Patent Number: 5,494,753
[45] Date of Patent: Feb. 27, 1996

[54] ARTICLES HAVING THERMAL CONDUCTORS OF GRAPHITE

[75] Inventor: Thomas R. Anthony, Schenectady, N.Y.

[73] Assignee: General Electric Company, Schenectady, N.Y.

[21] Appl. No.: 262,796

[22] Filed: Jun. 20, 1994

[51] Int. Cl.⁶ ........................................ B32B 9/00
[52] U.S. Cl. ................ 428/408; 428/901; 156/304.1
[58] Field of Search ............................ 428/408, 901; 156/304.1

[56] References Cited

U.S. PATENT DOCUMENTS

| | | | |
|---|---|---|---|
| 3,375,308 | 3/1968 | Turkat | 264/29 |
| 3,914,509 | 10/1975 | Tennent | 428/408 |
| 4,047,993 | 9/1977 | Bartelmuss | 428/408 |
| 4,878,152 | 10/1989 | Sauzade et al. | 428/408 |
| 4,929,489 | 5/1990 | Dreschhoff et al. | 428/408 |
| 5,224,030 | 6/1993 | Banks et al. | 361/717 |

OTHER PUBLICATIONS

Brown et al., Preparation and Properties of High–Temperature Pyrolytic Carbon, Conference on Industrial Carbon and Graphite (1957).
Slack, Phys. Rev., 127, 694–701 (1962).
Klein et al., Phys. Rev., 136, A575–A590 (1964).

*Primary Examiner*—Patrick J. Ryan
*Assistant Examiner*—Kam F. Lee
*Attorney, Agent, or Firm*—William H. Pittman

[57] ABSTRACT

Graphite is employed as a heat sink material, preferably with its c-planes perpendicular to the surface on which the heat-generating source is mounted at least in the portion in immediate contact with said source. The thermal conductivity of the graphite may be increased by heat treatment or by making it isotopically pure.

9 Claims, 4 Drawing Sheets

ARTICLES HAVING THERMAL CONDUCTORS OF GRAPHITE

BACKGROUND OF THE INVENTION

This invention relates to the dissipation of heat from heat generating objects.

Various areas exist in which heat conductors of very high thermal conductivity, hereinafter sometimes called "heat sinks", are necessary. These include electronic equipment, in which certain components generate heat. Another example is in repeating stations for fiber optic networks. Signals are transmitted by laser light over the fibers of such networks for very great distances. Since these signals decrease substantially in intensity over several kilometers, it is necessary to construct "repeating stations" periodically along the network, for the purpose of increasing the intensity of the light transmitted along the network. In a typical repeating station of this type, a photodetector is employed to convert the weakened signal transmitted by fiber optics to an electrical signal, which is then magnified, reconverted to a light signal by a light-emitting diode, and transmitted in turn along the next segment of the network.

In order to minimize the requisite number of repeating stations, optimum magnification of the signal in any station is desirable. However, the amount of radiant energy of any kind generated electrically is proportional to the fourth power of the current employed. While a portion of such radiant energy is in the form of light, the remainder thereof is lost as heat. In any individual station, therefore, very large amounts of heat are generated, requiring efficient heat sinks to maintain the operativeness of the repeating station.

Diamond is a promising material for use as a heat sink by reason of its very high thermal conductivity. This is particularly true of isotopically pure single crystal diamond, as disclosed in copending, commonly owned application Ser. No. 08/163,608.

However, several problems have been encountered in the use of diamond heat sinks. Natural diamond is prohibitively expensive for this purpose, or nearly so. The same is generally true of synthetic diamond prepared under high pressure-temperature conditions.

The production of polycrystalline diamond by chemical vapor deposition (hereinafter "CVD") in recent years has offered hope for a less expensive but still effective heat sink material. However, in addition to still being quite costly, CVD diamond is subject to stress cracking and other problems. Consequently, it has not gained wide use.

SUMMARY OF INVENTION

The present invention is based on the discovery that a very inexpensive material, graphite, is capable of being fabricated into heat sinks with high efficiency. In addition to having a high thermal conductivity when oriented in at least one direction, graphite has a much higher specific heat than diamond (2.05 and 1.48 cal./mol-°K., respectively) and various other advantages. It is also capable of rapid growth at much lower cost than diamond.

Accordingly, the invention in its broadest sense includes articles comprising a heat-generating source in contact with a thermal conductor comprising graphite.

BRIEF DESCRIPTION OF THE DRAWINGS

The drawings are schematic illustrations of various configurations of heat sinks comprising graphite which may be present in the articles of this invention.

DETAILED DESCRIPTION; PREFERRED EMBODIMENTS

Figure 1:
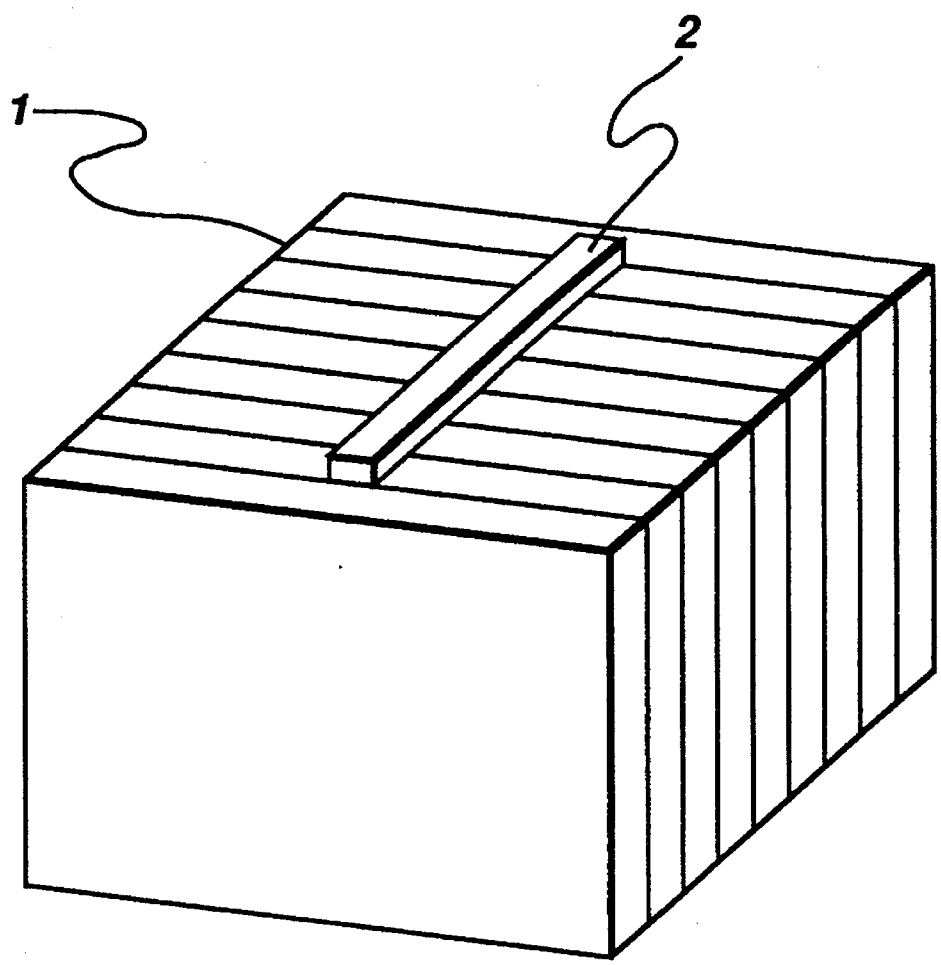

Any heat-generating source may be employed in the present invention. It is particularly applicable to electronic circuitry, as illustrated by multichip modules and integrated circuits, and repeating stations in fiber optic networks, particularly in connection with light-emitting diodes such as laser diodes employed in such stations.

Graphite suitable for use as a heat sink material in the articles of this invention may conveniently be produced from hydrocarbons such as methane by chemical vapor deposition on a suitable substrate such as graphite or tantalum. Methods for producing such graphite, commonly known as "pyrolytic graphite", are known in the art. In general, the hydrocarbon gas is passed into contact with a substrate heated to a temperature in the range of about 1900–2100° C. at subatmospheric pressure, for example in the range of about 10–100 torr. The deposited graphite may be removed from the substrate and conventionally worked, as by machining, to produce a heat sink of the desired size and shape.

Pyrolytic graphite grows at rates on the order of 1000 times greater than CVD diamond. For example, a graphite slab 1 mm. thick can be grown in only 1.5 hours as opposed to several days for a CVD diamond slab of the same thickness. Moreover, it is not necessary in the case of pyrolytic graphite deposition to maintain a high concentration of an unstable species such as atomic hydrogen at the substrate surface; all that is required is a uniformly heated substrate capable of decomposing the hydrocarbon feed gas.

In addition to the advantages relating to deposition feasibility and specific heat, the density of graphite is only 64% of that of diamond. Consequently, a graphite heat sink of a given weight will be more thermally conductive than a diamond heat sink of the same weight. The difference in density is particularly useful in the fabrication of multichip modules and the like.

Further, the Debye temperature of graphite is some 120° K. higher than that of diamond and the strength of graphite increases with increasing temperature while that of diamond decreases. Consequently, a graphite heat sink of a given weight will be more thermally conductive than a diamond heat sink of the same weight and the thermal conductivity will not decrease as much at high temperature or under conditions of contact with a transition metal. The difference in density is particularly useful in the fabrication of multichip modules and the like. Graphite, being less brittle, is also much easier to deposit in large, easy to handle slabs and to machine into suitable shapes for use as heat sinks without cracking than is diamond.

It is well known that graphite crystals are stacks of numerous planes of aromatically bonded carbon hexagons. Said planes are conventionally and hereinafter frequently designated "c- planes". While carbon-carbon bonding within the c-planes is very strong, it is generally much weaker between planes. Pyrolytic graphite grows with the c-planes parallel to the plane of the substrate.

The thermal conductivity of graphite in the c-plane is expected to be on the order of 20–30 W/cm.-°K., which is comparable to that of diamond. In perpendicular directions, it is only about 1 W/cm.-°K. Therefore, it is generally preferred for the crystal orientation of the graphite heat sink to be such as to provide maximum conduction of heat away from the heat-generating source. Various means of achieving this are described hereinafter.

As deposited, pyrolytic graphite tends to be polycrystalline with irregularly stacked c-planes. Thermal conductivity is increased by formation of large, regularly stacked c-planes. This may be done when desired by heat treating at a temperature in the range of about 2000–3800° C., preferably about 2500–3800° C., typically for a period in the range of about 1.5–3 hours. On the other hand, a less perfect crystalline form of graphite will have a greater hardness and may be easier to handle if some decrease in thermal conductivity is acceptable.

It is also expected that the thermal conductivity of isotopically pure graphite, like that of diamond, is substantially higher than that of graphite of normal isotopic distribution. Accordingly, in another embodiment of the invention the graphite is at least about 99.2% and preferably at least about 99.9% isotopically pure by weight; that is, the other isotope should be present in a maximum amount of 8 parts and preferably 1 part per thousand. By reason of its availability, relatively low cost and relatively high theoretical thermal conductivity, isotopically pure C-12 graphite is generally preferred over the C-13 isotope.

Reference is now made to the drawings for illustrations of heat sink configurations according to the invention. FIG. 1 illustrates a simple structure in which an individual heat-generating source, depicted as a laser diode, is employed. It is possible in these circumstances to employ a unitary heat sink construction in which graphite heat sink 1 has its c-planes perpendicular to the surface and perpendicular to laser diode 2 mounted thereon.

Figure 2:
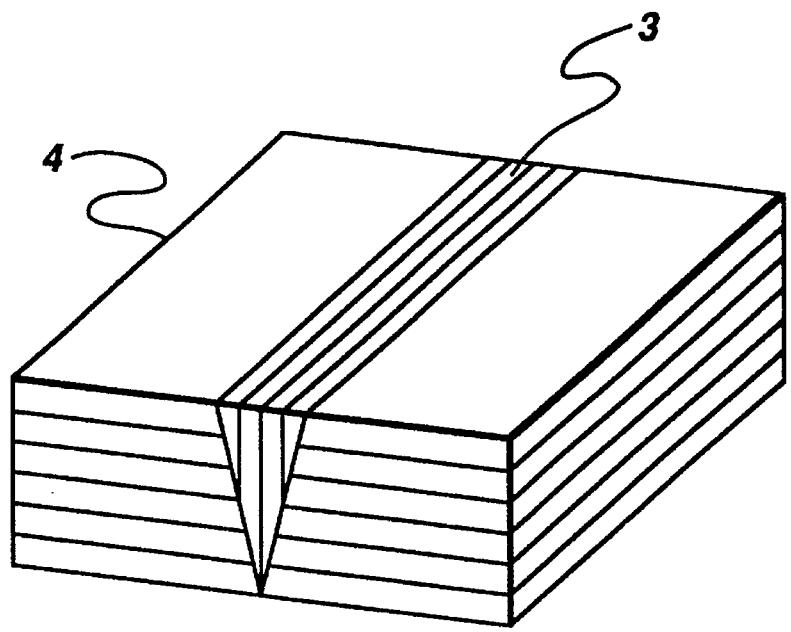
Figure 3:
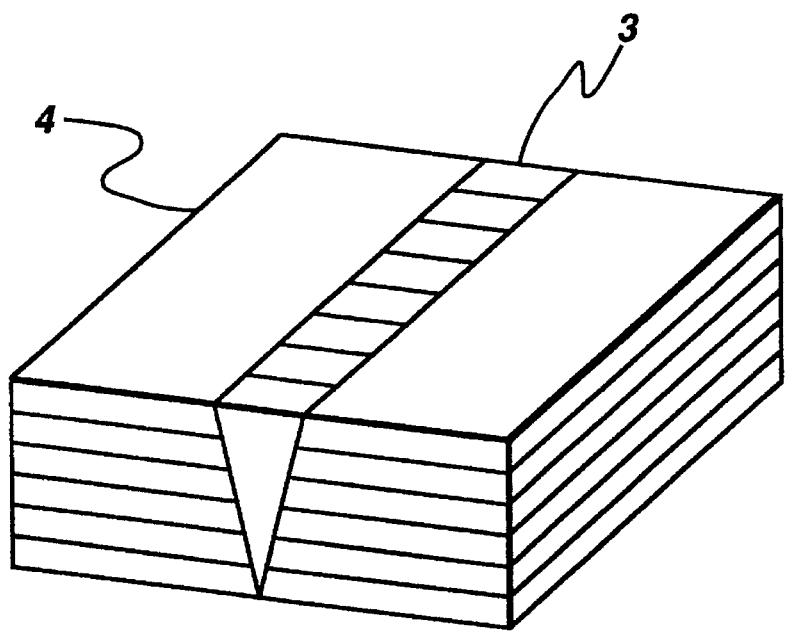

FIGS. 2–3 show two structures comprising graphite as the only heat sink material and particularly adapted to multichip modules. In each, the main body 4 of the heat sink has its c-planes parallel to the top surface and the portion in immediate contact with the heat-generating source, shown in said figures as a wedge-shaped groove in said main body 4, contains a graphite insert 3 whose c-planes are perpendicular to the surface on which said source is mounted. Said insert may be secured to the main body by a thin layer of a suitable adhesive or glue. In FIG. 2, the c-planes are parallel to and in FIG. 3 they are perpendicular to the length of the groove.

Figure 4:
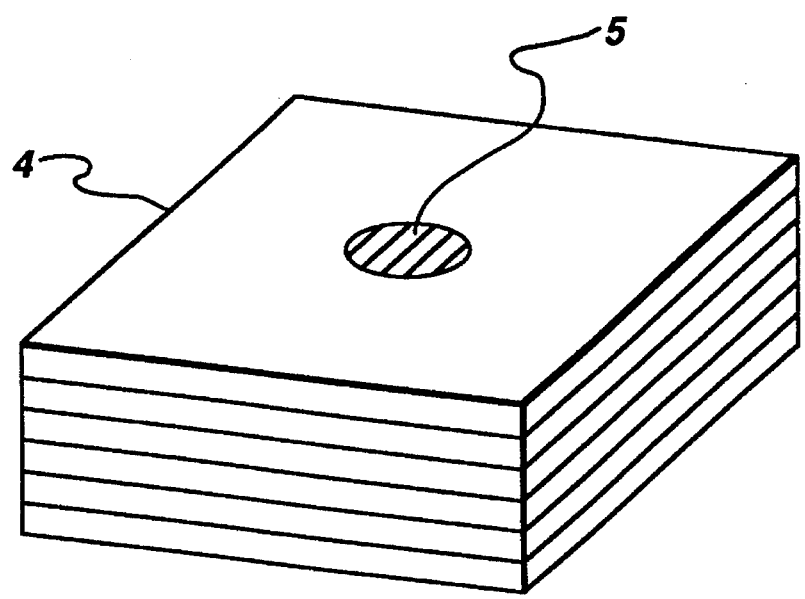

In FIG. 4, a graphite plug 5 with c-planes perpendicular to the surface is inserted in a hole in main body 4; the plug is shown as cylindrical, but other shapes may also be employed. The main body may be thermally expanded to permit installation of insert 5, or an adhesive layer may be employed.

In the embodiments of FIGS. 2–4, the configuration permits conduction of heat along the c-planes from the surface mounting of the heat-generating source into the body of main portion 1. It is then dissipated by transmission along the c-planes of said main portion in a direction parallel to its top surface.

Figure 5:
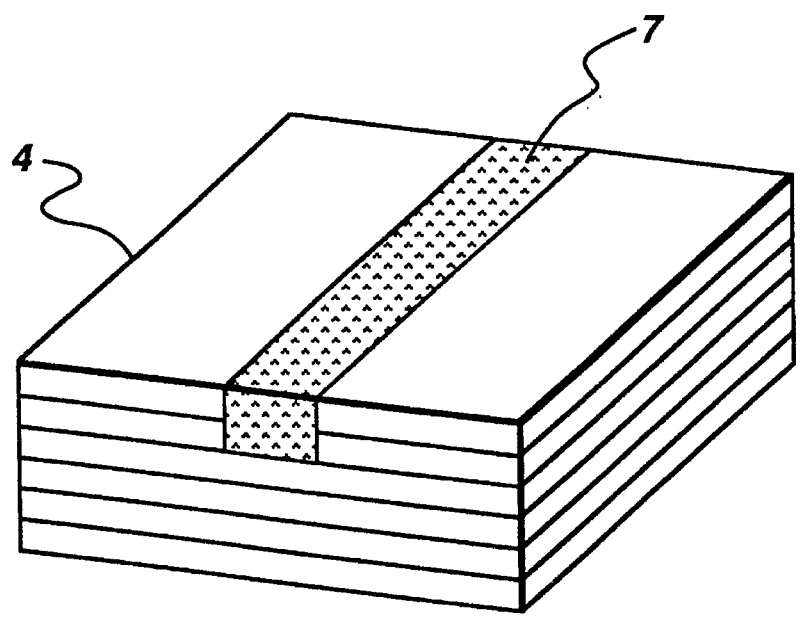

Another embodiment of the invention is shown in FIG. 5. Main body 4 of the graphite heat sink is fitted with diamond insert 7 in immediate contact with the heat-generating source. Said diamond insert may be a separate piece of natural or synthetic diamond pressed into the groove in main portion 1 or may be CVD diamond deposited therein. The heat generated by the source is transmitted downward through the diamond insert and is then dissipated through main portion 1 in a direction parallel to its top surface.

Since graphite is electrically conductive, it may be used in the simple form illustrated in FIGS. 1–5 only when conduction of electrical current from the heat-generating source is not detrimental. In many instances, however, it is required that the heat sink (or at least the portion thereof in contact with the heat-generating source) be an electrical insulator. In that case, a layer of material which is an electrical insulator or convertible to an insulator may be deposited on at least a portion of the graphite surface by such methods as chemical vapor deposition, physical vapor deposition or sputtering. Upon conversion of the surface portion of said layer, as by oxidation at temperatures in the range of about 1500–2000° C., an electrically insulating material is formed.

Figure 6:
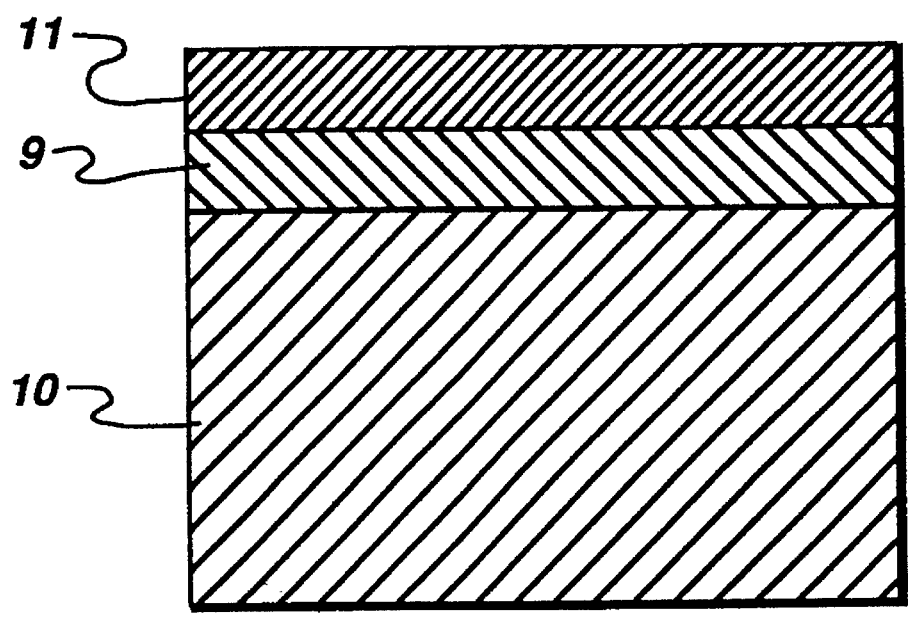
Figure 7:
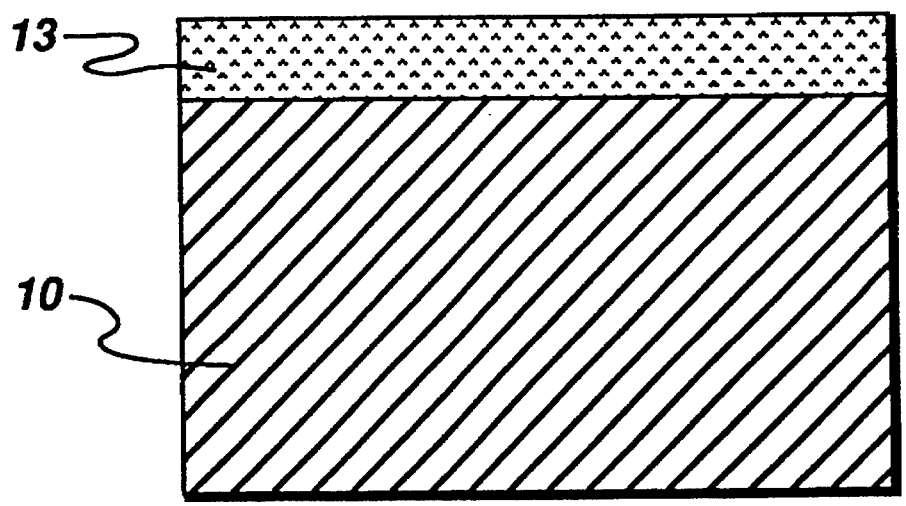

This is illustrated in FIGS. 6–7. In FIG. 6, a layer of silicon carbide is deposited on graphite heat sink 10, for example by exposure to a silane-containing atmosphere. The surface of said layer is then oxidized to silicon dioxide, with silicon dioxide layer 11 thus being formed on top of intermediate silicon carbide layer 9. In FIG. 7, a layer 13 of CVD diamond is grown on the surface of graphite heat sink 10.

The embodiment of FIG. 6 may also be employed when the heat sink is to be used at temperatures above about 600° C. The silicon dioxide surface coating passivates the graphite and protects it from oxidation.

What is claimed is:

1. An article comprising a heat-generating source in contact with a heat sink material consisting essentially of graphite that is at least about 99.2% isotopically pure.

2. An article according to claim 1 wherein the graphite comprises a plurality of regularly stacked c-plane.

3. An article according to claim 1 wherein the graphite is at least about 99.9% isotopically pure.

4. An article according to claim 3 wherein the graphite is at least about 99.9% carbon-12.

5. An article according to claim 2 wherein the c-planes of the portion of graphite in immediate contact with the heat-generating source are perpendicular to the surface on which said source is mounted.

6. An article according to claim 1 further comprising a diamond insert in immediate contact with said heat-generating source.

7. An article according to claim 1 further comprising a layer of material which is an electrical insulator on at least a portion of the graphite surface.

8. An article according to claim 7 wherein the insulator material is diamond.

9. An article according to claim 7 wherein the insulator material is silicon carbide with a layer of silicon dioxide on top of said silicon carbide.

\* \* \* \* \*